United States Patent [19]

Hounsfield

[11] 4,417,209
[45] Nov. 22, 1983

[54] NUCLEAR MAGNETIC RESONANCE APPARATUS

[75] Inventor: Godfrey N. Hounsfield, Newark, England

[73] Assignee: Picker International Limited, Wembley, England

[21] Appl. No.: 265,211

[22] Filed: May 19, 1981

[30] Foreign Application Priority Data

May 21, 1980 [GB] United Kingdom ............... 8016809

[51] Int. Cl.³ .......................................... G01R 33/08
[52] U.S. Cl. .................................... 324/309; 324/307
[58] Field of Search ............... 324/300, 307, 309, 318, 324/321

[56] References Cited

U.S. PATENT DOCUMENTS 4,070,611 1/1978 Ernst ................................... 324/309
4,333,053 6/1982 Harrison ............................. 324/307

Primary Examiner—Michael J. Tokar
Attorney, Agent, or Firm—Fleit, Jacobson, Cohn & Price

[57] ABSTRACT

In NMR imaging systems a pulsed field gradient may be applied across an excited slice (1) and the resonance signal detected during the field gradient pulse. It has been usual to demodulate the resonance signal at the Larmor frequency for a strip at the center of the slice, at which generally the field gradient has a zero-crossing. It has, however, been proposed to put the zero-crossing outside the slice, still demodulating at the slice Larmor frequency. In this invention demodulation is actually at the frequency for a probe (12) which is necessarily outside the patient. This makes the demodulation independent of errors in a local oscillator frequency. Demodulation may be for a probe effect to give a frequency for a strip outside the slice or the probe may be perpendicular to the gradient to give the zero-crossing frequency.

6 Claims, 2 Drawing Figures

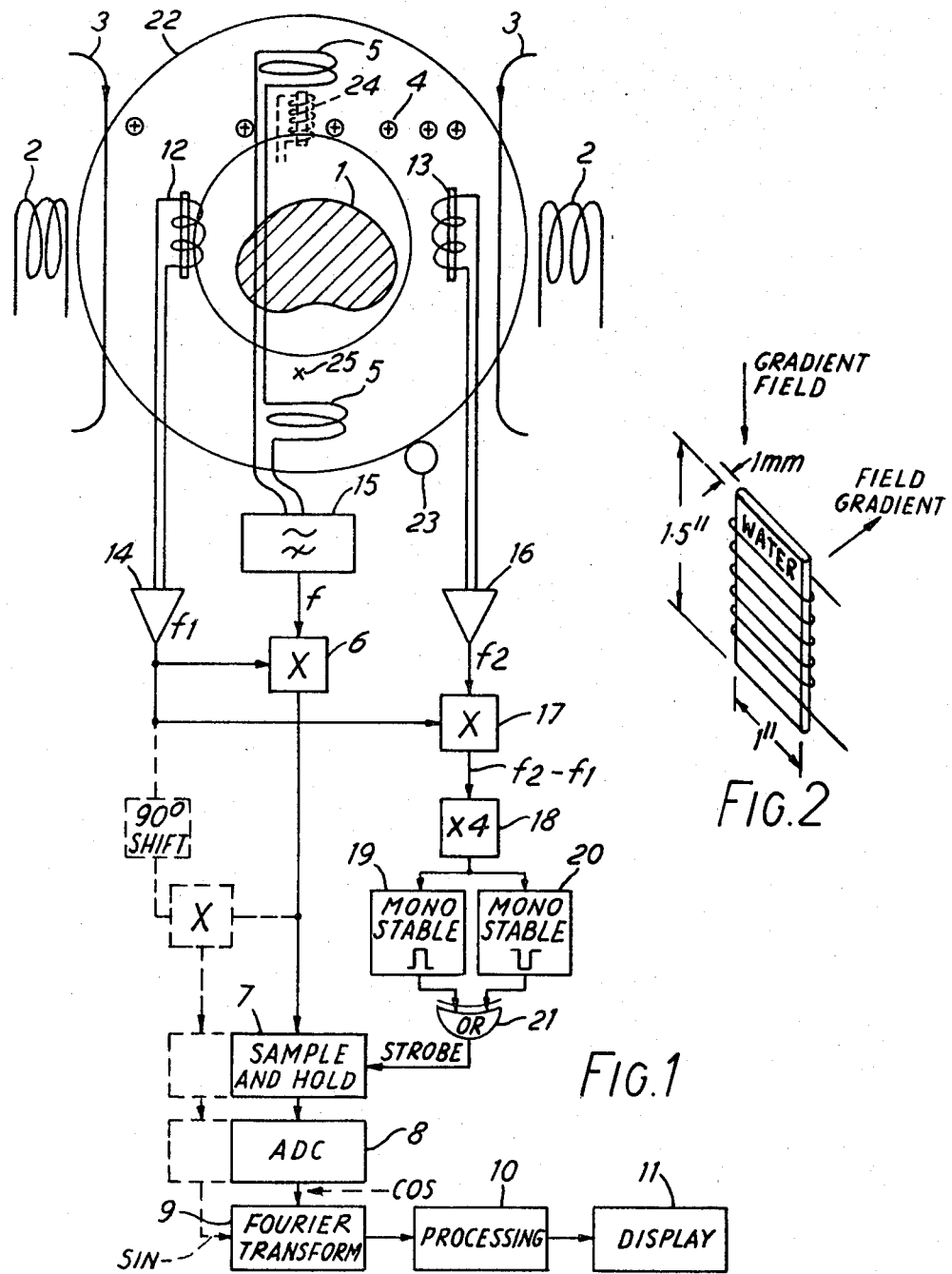

NUCLEAR MAGNETIC RESONANCE APPARATUS

The present invention relates to systems for investigating the distribution of a quantity, in a chosen region of a body, by nuclear magnetic resonance (NMR) techniques.

Nuclear magnetic resonance is known for the analysis of materials, particularly by spectroscopy. It has been suggested that the techniques be applied to medical examination to provide distributions of density of chosen nuclei, for example protons, or of relaxation time constants in sectional slices or volumes of patients. Such distributions are similar to, although of different significance from, the distributions of X-ray attenuation provided by computerized tomography (CT) systems.

Practical NMR apparatuses operate by applying suitable combinations of magnetic fields to the body being examined, via magnet (coil) systems, and detecting induced current in one or more detector coil systems. A suitable sequence of pulsed magnetic fields and apparatus to operate that sequence have been devised and, together with other improvements and related inventions, are disclosed and claimed in U.S. Pat. Nos. 4,254,778; 4,315,216; 4,284,948; 4,300,096; British Patent Application No. 22294/78 and U.S. Pat. No. 4,284,950.

In that arrangement a basic steady magnetic field is applied in a direction usually parallel to the axis of the patient's body. Other magnetic fields are then applied to cause resonance in a chosen cross-sectional slice of the patient. The resonance signal from the slice can then be detected. As it is detected there is applied a further field having a gradient in a chosen direction in the plane of the slice. This causes dispersion of the resonance frequencies in that direction and consequent phase dispersion in the resonance signal detected.

Frequency analysis of this signal, generally by Fourier Transformation, yields a plurality of resonance signals each for a different one of a plurality of strips perpendicular to the direction of the gradient. For analysis by CT X-ray techniques this procedure is repeated for many different directions of the gradient to provide a plurality of sets of signals for sets of strips in different directions.

An alternative procedure is described and claimed in U.S. Pat. No. 4,355,282.

In a practical system this gradient pulse is not applied as a square pulse but is of another shape, such as a distorted sinusoid, to suit practical considerations.

In U.S. Pat. No. 4,315,216 is disclosed that in such systems using field gradients during detection it is desirable to sample the resonance signal at intervals such that the gradient field integral, and therefore the change of phase of the resonance signal, is equal between sampling times. Such sampling is therefore at unequal intervals of time and for that reason the technique has been identified as "non-linear" or "stretch-time" sampling.

The sampled signals represent a range of frequencies near the resonance frequency for the slice (the Larmor frequency) at excitation and before the transverse gradient was applied. Generally the gradient is applied symmetricaly in the slice of the gradient field, being positive and negative about a strip through the centre of the slice. Thus the nuclei in the centre strip stay close to the Larmor frequency set without the gradient and those in strips on either side of the centre strip change in phase either positively or negatively from that value. To put the signals in a form for further processing it is the practice to demodulate them at the Larmor frequency for the centre strip so that the slices have frequencies positive and negative from zero. For these two sidebands it is of course necessary to demodulate in-phase and quadrature signals to retain phase information.

It is not essential for the demodulation to be at the frequency for a strip within the slice, such as a central one in which the gradient field is zero. For example U.S. Pat. No. 4,333,053, describes and claims a system in which the demodulation frequency is for a strip outside the examined region of the body. This has the advantage of moving artefacts due to demodulation and zero frequency to regions of the finally derived picture which do not represent the patient. Thus clinically useful information is not obscured. It also allows processing of a single sideband only.

The demodulation frequency is provided by a stable local oscillator since it will be appreciated that oscillator drift will render the demodulated signals is error and distort the final picture.

The system is, however, still liable to error from oscillator inaccuracies and drift and it is an object of this invention to provide an alternative arrangement.

According to the invention there is provided a Nuclear Magnetic Resonance apparatus including means for exciting resonance in nuclei in a substantially planar slice of the body of a patient, at the Larmor frequency for a magnetic field in said slice, means for imposing on said field an additional field having a gradient in a chosen direction in said slice, means for sensing a resonance signal from said slice in the presence of said gradient field, an NMR probe producing a signal of frequency related to a local value of the field in the plane of said slice, means for demodulating the resonance signal against the signal produced by the probe and means for processing the demodulated signal to produce a distribution of a quantity in said slice.

Preferably a second NMR probe is provided, displaced at least in the direction of said gradient from the first, the signals at different frequencies from the two probes are demodulated against each other to give a further signal at the difference frequency and this further signal is used to sample the demodulated resonance signal at intervals of equal phase change between the signals from the two probes.

In order that the invention may be clearly understood and readily carried into effect it will now be described by way of example with reference to the accompanying drawings, of which FIG. 1 shows an NMR apparatus incorporating the invention and FIG. 2 shows an NMR probe suitable for use with the invention.

In the NMR systems described in the aftermentioned patents and patent applications, field sensitive probes are provided to sense current values of the magnetic field at various positions around the examined slice. The outputs of these probes are used to control the application of the magnetic fields to ensure that the predetermined fields are obtained. The probes may be NMR probes. These are small containers of water surrounded by a coil. Preferably the water is doped to have a suitable value of $T_1$ relaxation time constant. The probes give a reliable resonance of 4.26 khz/Oe and if the water container is sufficiently small in the direction of the field variations being measured they can give adequate spatial resolution. The signals are also demodulated against a reference signal to give a suitable frequency output for measurement to indicate the field. Preferably they will also be demodulated at the frequency used for the main signal.

It is now proposed to demodulate the NMR signals from the main sensing coil against a signal derived from such an NMR probe. Such a probe will necessarily be outside the examined slice of the body and, if it is sufficiently displaced in the direction of the gradient from the strip at which the gradient field is zero, the system is therefore one example of demodulation at the Larmor frequency for a strip outside the body, as in U.S. Pat. No. 4,333,053 and has the advantages of that procedure. The difference from the prior procedure is however that the demodulation frequency is measured and not preset by a stable oscillator. Preferably two such coils are placed on opposite sides of the patient position and the difference between their outputs can be used to measure the phase change during the gradient pulse, and therefore to control the non-linear sampling.

The NMR apparatus incorporating this invention is shown in simplified form in FIG. 1. The apparatus has a patient positioning region in which the patient is placed with a cross-sectional slice 1 substantially central to the coil system. Coils, not shown, provide a uniform field and other field(s) necessary to create a unique field in the slice to be examined. These coils may be as described in said Patents and applications. Exciting coils 2 provide an RF magnetic field at the Larmor frequency for the unique field in the slice thus causing excitation selectively in the slice. Coils 3 provide a field (longitudinal of the patient) with a gradient across the slice, as indicated by the symbols 4. The gradient is pulsed, probably with a distorted sinusoid shape of pulse and during the pulse the NMR signal is detected in sensing coils 5.

The sensed signal is demodulated at a demodulator 6 with a suitable frequency and applied to a sample and hold circuit 7. Here it is sampled at a rate determined by a strobing pulse input to achieve the desired non-linear sampling. The samples are digitized in analog-to-digital converter 8 and Fourier transformed in circuits 9. Subsequently they are subject to the CT type of processing in circuits 10 (as described in U.S. Pat. No. 3,924,129) to provide a picture suitable for display at 11, with further processing optional for certain purposes.

As described so far the arrangement is substantially that described in the said Patents and applications. For this invention, however, two NMR probes 12 and 13 are provided on opposite sides of body 1. Probe 12 is for use in demodulating the NMR signal and probe 13 is for the optional method providing sampling strobe pulses. The probes are, in this example, each as shown in FIG. 2, giving high resolution in the direction of the field gradient. They are, as shown in FIG. 1, displaced in the direction of the field gradient giving field samples for strips lying outside the patient's body. The signal from probe 12, at frequency $f_1$, is amplified in head amplifier 14 and is applied to demodulator 6 for demodulating the NMR signal at frequencies f from coils 5. This latter signal has also been filtered in filter 15 to remove frequencies $f<f_1$. The demodulation provides frequencies ranging from zero, for a position in the plane of the slice at probe 12 (since $f_1$ beating with $f=f_1$ gives zero output), through higher frequencies towards that given by $f_1$ beating with $f=f_2$ i.e. for strips through slice 1. The removal of frequencies $f<f_1$ at 15 ensures that there will only be one sideband with frequencies above zero. This is the preferred arrangement for removing the unwanted lower sideband but the $f_1$ signal can also be phase shifted by 90° and demodulated again with f to give in-phase and quadrature signals to the Fourier transform circuits (broken lines). This enables the lower side-bands to be removed by determining them as negative frequency components.

In the optional additional procedure for providing the sampling strobe signals the second NMR probe 13 provides, at head amplifier 16, a signal at frequency $f_2$ which is demodulated with $f_1$ in demodulator 17 to give $(f_2-f_1)$ for strobing. This may be frequency multiplied at 18 (x 4 in this example) to give more frequent samples. Also in this example monostable circuits 19 and 20, give pulses at rising and falling zero crossings of $(f_2-f_1)$ (which are of course at equal phase change spacing) and by an exclusive OR gate 21 both sets of pulses are supplied to sample and hold 7 to provide the required sample strobing. This detailed arrangement can clearly be varied considerably to derive equal phase interval strobe pulses from $(f_2-f_1)$. It should be noted that NMR probes 12 and 13 should be at adequate spacing for this purpose and such spacing is assured by their being on opposite sides of the patient.

Considering the system described so far it will be appreciated that it will operate in straightforward manner for sampling and demodulating NMR resonance signals sensed during application of a gradient produced by coils 3, i.e. aligned with probe coils 12 and 13. In many NMR systems the gradient direction is caused to rotate about an axis perpendicular to the plane of the slice. As described in the said patents and applications this is achieved by providing a further set of gradient coils such as 3, orthogonal to the first set. The second set will produce an orthogonal gradient field and the resultant, which is the effective gradient field is rotated by varying the relative amplitudes of the two components.

In a preferred embodiment of this invention probes 12 and 13 are rotated with the field gradient to be at all times in the same position relative to it. It is proposed for that purpose that probes 12 and 13 should be mounted on a turntable 22 to be rotated about body 1 by a motor 23. This should preferably be a stepping motor with examination for each angular position being effected at a dwell in the rotation. The rotation may readily be controlled by circuits present in NMR apparatus to control the gradient orientation. It will be appreciated, however, that if the probes are to be rotated about the body it is a simple expedient to achieve the rotation of the field gradient by rotation of one set of coils 3 about the body. Coils 3 and 5 may conveniently be mounted on the turntable 22.

It has been assumed so far that the probe 12 used for demodulation should be displaced from the centre of rotation in the direction of the field gradient, that is to demodulate at the Larmor frequency for a strip wholly outside the body. This is not necessarily so and demodulation may be at the Larmor frequency for any strip in the plane, with appropriate corrections.

The most straightforward alternative would be to use a probe indicated at 24, displaced perpendicular to the direction of the gradient so as to lie in the strip for which the gradient field is zero. This would be demodulation as described in said patents, except that the demodulation frequency is provided as measured by a probe and not from an oscillator, and so in-phase and quadrature components must be preserved.

If it is desired to use fixed probes it should be noted that the gradient will not always be aligned with the probe so that the sample (water container) should be a narrow tube perpendicular to the plane of the slice to be of good resolution in all directions. There will also need to be a correction made appropriate to the angle at which the line joining the two probes cuts the gradient. When the field gradient is perpendicular to that line it is suggested to use a second pair orthogonal to the first, that is at positions 24 and 25 with appropriate orientation. From the signals received from four such probes frequencies can be calculated to be equivalent to the frequencies which would have been provided by rotating probes.

An alternative system, which in one form is described in U.S. Pat. No. 4,355,282, requires only orthogonal field gradients and not gradients at many different angles. For that system therefore it would suffice to use two complete orthogonal sets of gradient coils and probes, as in FIG. 1, as alternatives.

Other embodiments of the invention will be apparent to those skilled in the art.

What I claim is:

1. A nuclear magnetic resonance apparatus including means for exciting resonance in nuclei in a substantially planar slice of the body of a patient, at the Larmor frequency for a magnetic field in said slice, means for imposing on said field an additional field having a gradient in a chosen direction in said slice, means for sensing a resonance signal from said slice in the presence of said gradient field, a first NMR probes for producing a signal of a frequency related to a local value of the field in the plane of said slice, means for demodulating the resonance signal against the signal produced by said probe, and means for processing the demodulated signal to produce a distribution of a quantity in said slice.

2. An apparatus according to claim 1 in which the probe is displaced in the direction of the gradient from a line at which the gradient field has a zero value to demodulate at a frequency offset from said Larmor frequency.

3. An apparatus according to claim 1 in which the probe is displaced from the centre of the slice in a direction orthogonal to the direction of the field gradient to be substantially in a line at which the gradient field has a zero value and demodulate at said Larmor frequency.

4. An apparatus according to claims 1, 2 or 3 in which means are provided for rotating the direction of the field gradient in the plane of the slice and means are also provided for orbiting said probe, in said plane, about the centre of rotation of the gradient field.

5. An apparatus according to claim 4 in which the means for imposing the gradient field are mounted to be orbited in the plane of the slice thereby to effect rotation of the direction of the field gradient in said plane.

6. An apparatus acording to claim 1 in which a second NMR probe is provided, displaced at least in the direction of field gradient from the first NMR probe and means are provided for demodulating the signals from the first and second probes against one another to give a further signal at the difference frequency and for using the further signal to sample the demodulated resonance signal at intervals of equal phase change between signals from the first and second probes.

* * * * *